United States Patent [19]

Komatsu et al.

[11] Patent Number: 4,763,189
[45] Date of Patent: Aug. 9, 1988

[54] COLOR IMAGE SENSOR WITH THREE LINE SENSORS ON DIFFERENT LAYERS SEPARATED BY ELECTRICALLY-INSULATING LAYERS

[75] Inventors: Toshiyuki Komatsu, Yamato; Masaki Fukaya, Yokohama; Tatsumi Shoji, Hiratsuka; Masaru Kamio, Atsugi; Nobuyuki Sekimura; Katsumi Nakagawa, both of Kawasaki; Hirofumi Iwamoto, Machida; Shinichi Seitoh, Isehara, all of Japan

[73] Assignee: Canon Kabushiki Kaisha, Tokyo, Japan

[21] Appl. No.: 28,052

[22] Filed: Mar. 19, 1987

Related U.S. Application Data

[63] Continuation of Ser. No. 908,883, Sep. 15, 1986, which is a continuation of Ser. No. 770,085, Aug. 28, 1985, abandoned.

[30] Foreign Application Priority Data

Aug. 31, 1984 [JP] Japan .................. 59-180684
Sep. 4, 1984 [JP] Japan .................. 59-183746

[51] Int. Cl.$^4$ ............ H04N 1/46; H04N 1/028; H01L 27/14; H01L 31/00
[52] U.S. Cl. ...................... 358/75; 358/294; 357/30
[58] Field of Search ........... 358/75, 294; 357/24 LR, 357/30 H

[56] References Cited

U.S. PATENT DOCUMENTS

| | | | |
|---|---|---|---|
| 4,305,100 | 12/1981 | Hattori | 358/294 |
| 4,360,821 | 11/1982 | Tsukada et al. | 357/24 LR |
| 4,404,586 | 9/1983 | Tabei | 358/43 |
| 4,438,455 | 3/1984 | Tabei | 358/43 |
| 4,443,813 | 4/1984 | Tabei | 358/43 |
| 4,471,375 | 9/1984 | Oritsuki et al. | 358/294 |
| 4,482,804 | 11/1984 | Oritsuki et al. | 358/294 |
| 4,514,755 | 4/1985 | Tabei | 358/43 |
| 4,558,357 | 12/1985 | Nakagawa et al. | 358/75 |
| 4,567,529 | 1/1986 | Yamaguchi et al. | 358/294 |
| 4,583,126 | 4/1986 | Stoffel | 358/294 |
| 4,613,895 | 9/1986 | Burkey et al. | 357/24 LR |
| 4,663,656 | 5/1987 | Elabd et al. | 358/75 |
| 4,675,535 | 6/1987 | Tsunekawa et al. | 357/30 H |

FOREIGN PATENT DOCUMENTS

| 55-146406 | 11/1980 | Japan . | |
|---|---|---|---|
| 61267 | 4/1984 | Japan | 358/75 |

OTHER PUBLICATIONS

Gove, Philip Babcock, Editor in Chief et al., *Webster's Third New International Dictionary*, G. & C. Merriam Company, date unknown, see entry for "Ommateal".

Primary Examiner—John W. Shepperd
Assistant Examiner—Randall S. Svihla
Attorney, Agent, or Firm—Fitzpatrick, Cella, Harper & Scinto

[57] ABSTRACT

A line sensor for color reading comprises a plurality of line sensors, each having photosensors arranged one-dimensionally, for the number of the color signals to be separated arranged in parallel with each other on one and the same substrate; and a color filter for color signal separation directly disposed on the light-receiving portion of each of said line sensors. The parallel line sensors may be disposed so as to be non-coplanar, e.g., by provision of insulating layers at least on wiring sections of the first and second line sensors, the second and third line sensors being disposed on the first and second insulating layers, respectively.

8 Claims, 9 Drawing Sheets

COLOR IMAGE SENSOR WITH THREE LINE SENSORS ON DIFFERENT LAYERS SEPARATED BY ELECTRICALLY-INSULATING LAYERS

This application is a continuation of application Ser. No. 908,883 filed Sept. 15, 1986, which, in turn, was a continuation of Ser. No. 770,085, filed Aug. 28, 1985 now abandoned.

BACKGROUND OF THE INVENTION

1. Field of the Invention

This invention relates to a line sensor for color reading which is a reading means for reading a color manuscript for each line through color separation and a color image reading device.

2. Description of the Prior Art

In the prior art, in facsimiles, digital copying machines or electronic file systems, it has been practiced to read a manuscript image information while scanning each line. More specifically, a line sensor is constituted by arranging one-dimensionally photosensors having light-receiving portions with adequate sizes and, by moving said line sensor relative to the manuscript in the direction substantially perpendicular to the lengthwise direction of said line sensor, the manuscript is successively read with the size of the manuscript surface corresponding to the size of the light-receiving portion of the photosensor as one image element.

And, in recent years, it is gradually becoming demanded to read colors.

In this context, as the general method for performing reading by use of a line sensor, there is the method in which CCD is used as the photosensor and image formation of the manuscript surface is effected on CCD by use of a reduction image forming optical system. However, in such a reading method, it is required to take a longer optical path length of the image forming optical system as the line sensor is made longer, whereby the device will disadvantageously become enlarged. Also, due to the small area of each light-receiving element of CCD, it is lower in sensitivity and therefore it is required to intensify the manuscript illumination light source or to retard reading speed. In particular, CCD is lower in sensitivity to blue color and hence the problem remains in the case of color reading.

Another method for performing reading by use of a line sensor, there is the method in which the so called planar type photoconductive type photosensor as the photosensor and an erecting equimultiple image forming optical system such as rod lens array, etc. is used (namely the method according to the so called contact type line sensor). According to this method, the optical path length of the optical system may be smaller, whereby miniaturization of the device can be realized.

A planar type photoconductive photosensor can be constituted by arranging a pair of electrodes by provision of a gap constituting at least a part of the light-receiving portion on a photoconductive layer such as of chalcogenide, CdS, CdSSe, amorphous silicon (hereinafter written as a-Si), etc. Particularly, a planar type photoconductive photosensor by use of a-Si is good in light response speed and also large in output photocurrent, and therefore a good line sensor can be prepared therefrom. Also, a-Si materials, which are free from pollution and for which silicon technology such as the plasma CVD technique, photolithographic patterning technique, etc. may be employed, are also excellent in productivity. Further, as shown in FIG. 1, an a-Si photosensor has a spectral sensitivity which is approximate to the specific visionary sensitivity, thus having a great adaptability for a color sensor. In other words, the output photocurrent values of the photosensor relative to the same energy light each of 10 $\mu W/cm^2$ at blue 450 nm: green 550 nm: red 650 nm are 2: 3.5: 3, thus being flat in spectral sensitivity, which is preferred for a color photosensor.

As the method for performing color reading in such a contact type line sensor, it has been known to arrange, for example, linear light sources of three colors of red, green and blue at the light source for manuscript illumination in parallel to the line sensor and red successively the respective color signals with one line sensor by lighting successively the light sources of respective colors. Whereas, under the present situation, there is no small scale blue light source which can give sufficient dosage as a linear light source, whereby miniturization of the device cannot sufficiently be effected. Also, according to this method, since reading of the three colors is performed under the same optical system arrangement condition for the same image element of the manuscript, there is involved the problem that a considerable time is required for reading.

On the other hand, another method for performing color reading in a contact type line sensor comprises arranging, for example, color filters of red, green and blue at positions corresponding to the light-receiving portions of the respective photosensors, grouping the three colors of red, green and blue in the arrangement of the color filters, dividing one image element of the manuscript surface corresponding to the three photosensors of one group into three divisions and reading the color signal obtained from each division as a typical value of each color signal of the image element (psuedo-same point reading). However, since this reading method reads the color signals of respective colors from substantially different manuscript surfaces, the quality of the image read will be lowered, and thus there may be involved the problem of causing lowering in image quality such that a monochromatic brim may appear on a black letter image in the outputted image synthesized from the color signals of three colors obtained.

On the other hand, as another requirement, it is desired for an image sensor that the reading time should be as short as possible and the energy required for illumination of an object as small as possible. For this purpose, the image forming optical system to be used is required to be as light as possible.

However, a light optical system to be used in a colored system has a problem. That is, in a light image forming optical system, the image forming position tends to differ frequently depending on the wavelength of light.

Therefore, when an image sensor is provided at the image forming position of a light with a specific wavelength (e.g. a green light), resolution will markedly be lowered relative to the lights with other wavelengths (e.g. red light, blue light). For this reason, it is necessary to use a dark image forming optical system with little of such a tendency or prepare separate image forming optical systems for lights with respective wavelengths, thus involving great drawbacks in aspects of high speed reading, compaction, cost, etc. of an image sensor.

Accordingly, some the present inventors, with others, have proposed a color image reading method and device which can cancel the above drawbacks (U.S.

Pat. application Ser. No. 505,270, filed June 17, 1983, now U.S. Pat. No. 4,558,357, The color image reading device according to this proposal (hereinafter referred merely as the prior art device) comprises a plurality of line image sensors being provided corresponding to the lights within wavelength ranges corresponding to specific colors, said image sensors in respective lines being arranged at the image forming positions where the resolution of the light within said wavelength ranges can be maximum.

FIG. 2 is a schematic illustration of the construction of the prior art device.

In this figure, the manuscript 202 moving in the direction of the arrowhead A is illuminated by a light source 204, and the image on the illuminated will manuscript 202 form an image on a substrate 208 through the ommateal optical system 206. On the substrate 208, photosensor arrays 210, 212 and 214 are formed, and on the respective photosensor arrays are provided a red filter 216 with wavelength range corresponding to red color, similarly a green filter 218 and a blue filter 220, respectively. Also, the photosensor arrays 210, 212 and 214 are arranged at the positions where the respective color components of the image on the manuscript 202 at the positions L1, L2 and L3 form images, respectively.

In such a construction, the images at the respective portions on the manuscript 202 will be read, while moving toward the direction of the arrowhead A, at the position L1 of the red component by the photosensor 210, at the position L2 of the green component by the photosensor 212 and at the position L3 of the blue component by the photosensor 214, respectively. Accordingly, the respective color components of the manuscript 202 enter accurately the respective photosensor arrays, whereby reading of high resolution can be effected.

However, in such a device of the prior art, it is difficult to ensure the wiring space for the photosensor array 212 positioned at the center, particularly difficult in the case of a matrix wiring. Further, if the three photosensor arrays are formed on the same substrate 208, the generation probability of rejected sensors per one substrate will be increased with an increase of the number of the photosensors, whereby there is involved the problem of lowering in production yield, for the number of the color signals to be separated and arranged in parallel each other on one and the same substrate, and a color filter for color signal separation directly disposed on the light-receiving portion of each of said line sensors.

SUMMARY OF THE INVENTION

A primary object of the present invention is to provide a line sensor for color reading and a color image reading device which has overcome the drawbacks and problems of the prior art as described above.

Another object of the present invention is to provide a line sensor for color reading and a color image reading device which can perform image reading of high resolution at high speed and can also be produced easily with good yield.

According to one aspect of the present invention there is provided a line sensor for color reading, comprising a plurality of line sensors, each having photosensors arranged one-dimensionally, for the number of the color signals to be separated arranged in parallel with each other on one and the same substrate; and a color filter for color signal separation directly disposed on the light-receiving portion of each of said line sensors.

According to another aspect, there is provided a color image reading device comprising:

(1) An image sensor comprising: a plurality of photosensor arrays, each having a plurality of photosensors arranged on a substrate, for the number of the colors laminated successively; and color filters for the number of said photosensor arrays, the photosensors constituting said photosensor arrays for each color being arranged at the optimum image forming position for the light within the wavelength range of the corresponding color, (2) an illuminating means for irradiation of light on a manuscript surface; and (3) an optical image forming means for forming an image on the light-receiving surface of said photosensor from the image on the manuscript surface.

DETAILED DESCRIPTION OF PREFERRED EMBODIMENTS

Referring now to the accompanying drawings, specific embodiments of the present invention are described in detail.

Figure 3:
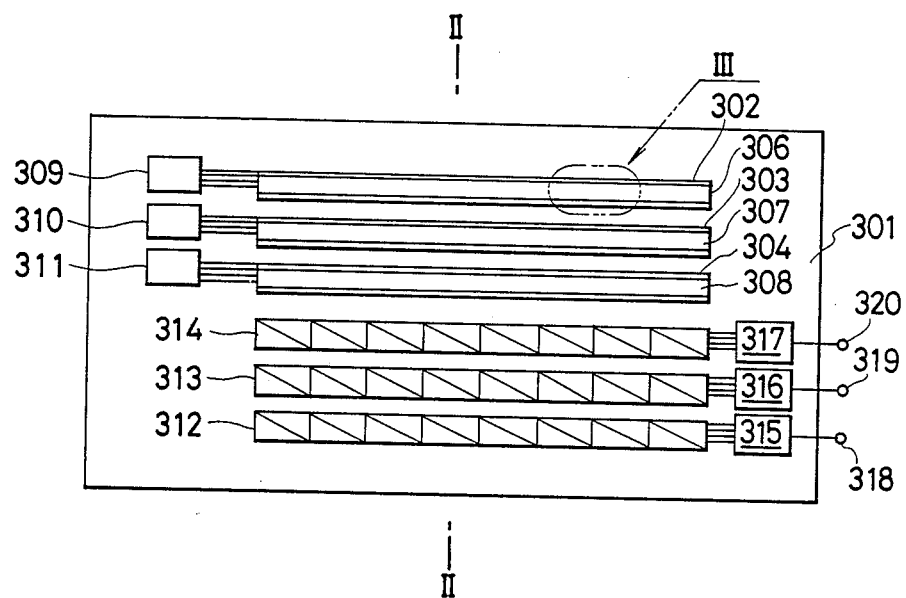
FIG. 3 is a schematic plan view of a line sensor for color reading of the present invention.
Figure 4:
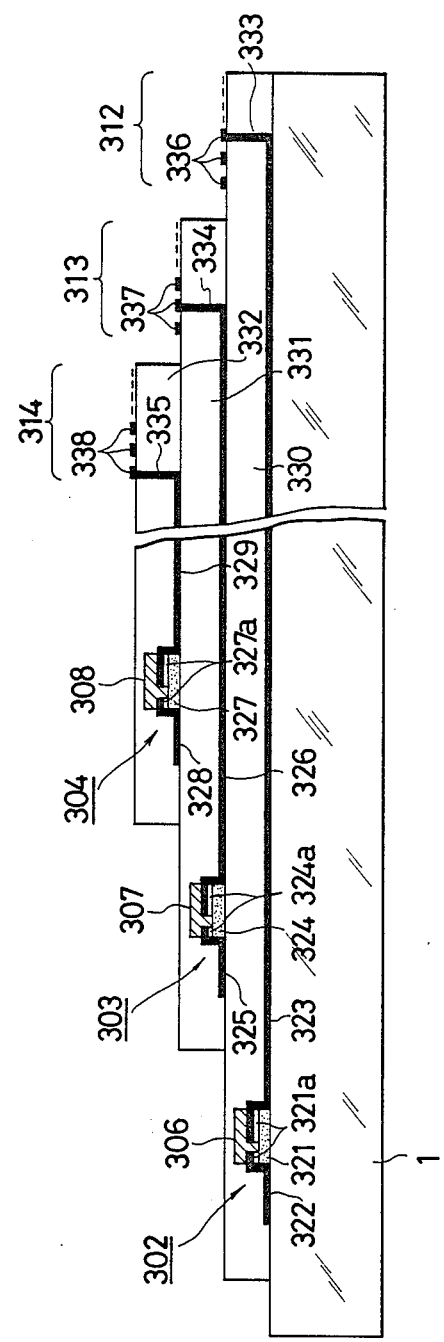
FIG. 4 is a sectional view taken on line II—II in FIG. 3.

FIG. 3 is a schematic plan view showing an embodiment of the line sensor for color reading according to the present invention, and FIG. 4 is a sectional view taken along II—II thereof.

In FIG. 3, three photosensor arrays, namely line sensors 302, 303 and 304 are formed in parallel on a substrate 301. Each of the line sensors 302, 303 and 304 comprises a plurality of photosensing elements, or pixels, which are preferably of a uniform size, and each of which reads an element of original image. On the line sensor 302 is attached a red color filter 306, on the line sensor 303 a green color filter 307 and on the line sensor 304 a blue color filter 308. 309, 310 and 311 are driver IC for applying successively driving voltages on the respective photosensors of the line sensors 302, 303 and 304, respectively. 312, 313 and 314 are matrix wiring sections for reading signals of the line sensors 302, 303 and 304, respectively, and these are connected to signal processing IC 315, 316 and 317 for amplification, sample hold and analog switch and the like, respectively. The red signal, the green signal and the blue signal are taken out from the output lines 318, 319 and 320, respectively.

In FIG. 4, 321 is an a-Si photoconductive layer, 321a is a n+ layer, 322 is a common electrode, 323 is an individual electrode, and these are related to the line sensor for red color. Similarly, 324 is an a-Si photoconductive layer, 324a is a n+ layer, 325 is a common electrode, 326 is an individual electrode, and these are related to the line sensor for green color. Also, 327 is an a-Si photoconductive layer, 328 is a common electrode, 329 is an individual electrode, and these are related to the line sensor for blue color.

330, 331 and 332 are transparent insulating layers, 333, 334 and 335 are contact holes formed for matrix wiring on said insulating layers 330, 331 and 332, respectively, 336, 337 and 338 are signal take-out electrodes constituting the matrix wiring sections 312, 313 and 314, respectively.

Figure 5:
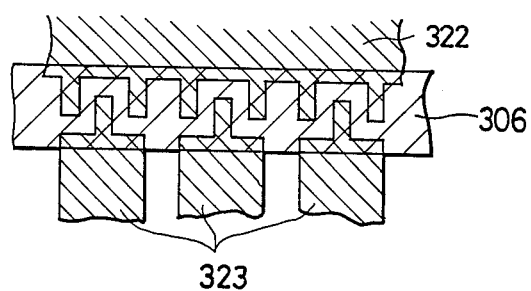
FIG. 5 is an enlarged view of the portion III in FIG. 1.

FIG. 5 is a partial enlarged view of the portion III, namely the photosensor portion of the line sensor for red color, and here three continuous photosensors are shown. As shown in FIG. 5, in this embodiment, the gap between the common electrode 322 and the individual electrodes 323 lies in a zig-sag line, whereby the resistance (light resistance and dark resistance) of each photosensor can be made smaller to take out a great signal current.

In this embodiment, all of the three line sensors 302, 303 and 304 for each color have 3500 photosensors over the length of about 220 mm.

The line sensor for color reading of this embodiment as described above can be prepared as follows.

First, a #7059 glass substrate 301 produced by Corning Co. is set in a glow discharge decomposition device and silane gas (100% SiH₄) is subjected to high frequency (13.56 MHz) glow discharge decomposition to form a non-doped a-Si photoconductive layer 321 with a thickness of about 1 $\mu$m on the substrate 301. Subsequently, high frequency glow discharge decomposition is similarly effected in an atmosphere of a gas mixture of the above silane gas with 0.5% of phosphine (PH₃) gas to form a n+ layer of phosphorus-doped a-Si with a thickness of about 0.1 $\mu$m on the a-Si photoconductive layer 321. Next, said substrate 301 is set in a vacuum deposition device for sputtering, and an aluminum layer with a thickness of about 0.3 $\mu$m is formed on the n+ layer. Subsequently, the steps of photoresist coating-pattern exposure-developing-etching are conducted to form a common electrode 322 and individual electrodes 323 as shown in FIG. 5. Then, dry etching removal of n+ layer at the exposed portion is effected by performing plasma etching with CF₄ gas with the common electrode 322 and the individual electrodes 323 as the mask, thereby forming a desired n+ layer 321a as shown in FIG. 4.

Next, pattern formation is effected by use of a positype photoresist, and a red colorant layer with a thickness of about 2000°Å is imparted thereon by vapor deposition and a red color filter 306 as shown in FIG. 4 and FIG. 5 is formed according to the lift-off method.

Then, according to the screen printing method, a polyimide resin is applied to form an insulating layer 330, and a contact hole 333 for connecting the individual electrodes 323 and the signal take-out electrode 336 of the matrix wiring section 312 is formed at a predetermined position of said insulating layer 330.

Subsequently, according to similar steps, a line sensor 303 for green color is formed on the insulating layer 330. In the same step for formation of the common electrode 325 and the individual electrodes 326, the signal take-out electrode 336 of the matrix wiring section 312 for red color is also formed.

Subsequently, according to similar steps, a line sensor 304 for blue color is formed on the insulating layer 331. In the same step for formation of the common electrode 328 and the individual electrodes 329, the signal take-out electrode 337 of the matrix wiring section 313 for green color is also formed.

Finally, the signal take-out electrode 338 of the matrix wiring section 314 for blue color is formed on the insulating layer 332.

As described above, the line sensor for red color, the line sensor for green color and the line sensor for blue color are formed according to the photolithographic patterning process, and therefore registration mutually between the respective line sensors can be done accurately with relative ease. More specifically, the respective line sensors are generally formed with a distance corresponding to 2 to 250 lines (about 200 $\mu$m to 1.5 cm when about 16 photosensors are provided per 1 mm as in the above embodiment) apart from each other, and the deviation from parallel between these lines can be made a ½ line (about 10 $\mu$m) or less. Also, the pitch deviation of the respective photosensors within each line sensor can, as a whole, be made a ½ line or less. Further, the alignment error of the whole line sensor can be made a ½ line or less.

In the above embodiment, the color filter is formed as the pattern-shaped dye layer by the lift-off method after vapor deposition of the colorant. According to this method, the color filter, composed of a pigment as a main component, is extremely good is light resistance and heat resistance.

Also, since the colorant is formed into a film by vapor deposition, the colorant layer is formed in parallel to the surface of the photosensor even if the surface may be uneven, whereby spectral characteristics will not vary from place to place. Further, pattern working according to photolithography by use of a resist enables preparation according to the same photo-process as in preparation of the photosensor, whereby the color filter can be formed with good precision even in the case of a long line sensor. It will also have no influence on the photoconductive characteristics of the photosensor already formed.

The dye to be used in vapor deposition may be a colorant capable of sublimation or evaporation, and a colorant insoluble in the solvent to be used for dissolving the resist mask may conveniently be used. The colorants satisfying these conditions may include various colorants such as acetoaceticanilide colorants, monoazo colorants of naphthols, polycyclic colorants, disperse colorants, oil-soluble colorants, indanthrene colorants, phthalocyanine colorants and combinations of these colorants.

Particularly preferable red colorants are perylenetetracarboxylic acid derivatives, and examples thereof are enumerated below (shown below by the symbols 1 to 8):

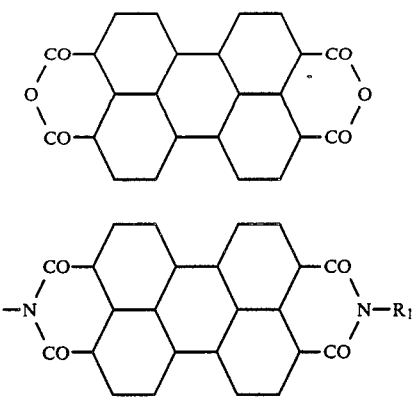

(1) (3,4,9,10-perylene-tetracarboxylic dianhydride)
(2) Compound of the above formula, wherein $R_1$ is —H;
(3) Compound of the above formula, wherein $R_1$ is —CH$_3$;
(4) Compound of the above formula, wherein $R_1$ is

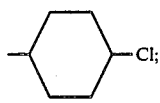

(5) Compound of the above formula, wherein $R_1$ is

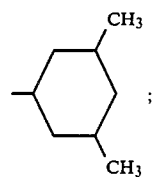

(6) Compound of the above formula, wherein $R_1$ is

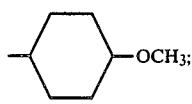

(7) Compound of the above formula, wherein $R_1$ is

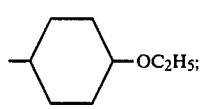

(8) Compound of the above formula, wherein $R_1$ is

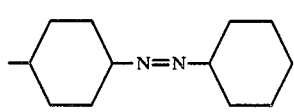

However, the perpylenetetracarboxylic acid derivatives are not limited to these compounds.

Commercially available perylenetetracarboxylic acid derviatives (trade names) include the following: Peryndomaroon R6434 (prodced by Bayer) CI No. 71130 Novapalm Red BL (produced by Hoechst) CI No. 71137 Pariogen Red L3870HD (produced by BASF) CI No. 71145 Irgadine Red BPT (produced by Ciba Geigy) CI No. 71127

On the other hand, green colorants may include phthalocyanine colorants, combinations of phthalocyanine colorants and isoindolinone colorants or phthalocyanine colorants and anthraquinone colorants as preferable examples.

Typical examples of phthalocyanine colorants may include metal-free phthalocyanine, copper phthalocyanine, berylium phthalocyanine, magnesium phthalocyanine, zinc phthalocyanine, titanium phthalocyanine, tin phthalocyanine, lead phthalocyanine, vanadium phthalocyanine, chromium phthalocyanine, molybdenum phthalocyanine, manganese phthalocyanine, iron phthalocyanine, cobalt phthalocyanine, nickel phthalocyanine, palladium phthalocyanine, platinum phthalocyanine and the like.

Isoindolinone colorants have aromatic fused polycyclic structures containing heteroatoms, and may be represented basically by the following formula:

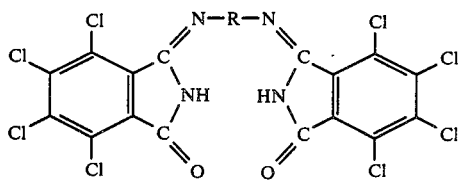

Those in which 4, 5, 6 and 7 positions are not substituted with chlorine may also be included, but substituted type compounds are preferred with respect to light resistance and solvent resistance.

Depending on the structure of R in the formula, the color will vary from yellow to orange, even to reddish brown, and these colorants are particularly excellent as yellow colorants for colorfulness and sharp spectral characteristics.

Typical examples of isoindolinone colorants may include those wherein R in the above formula is represented by the following groups:

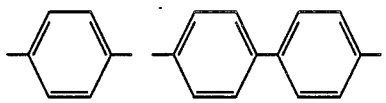

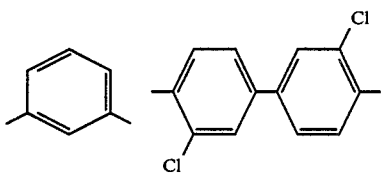

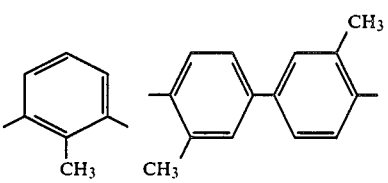

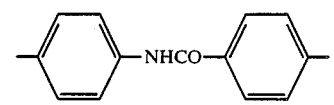

-continued

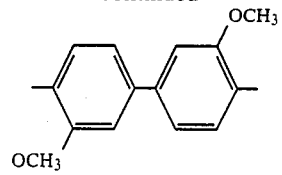

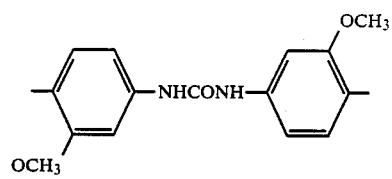

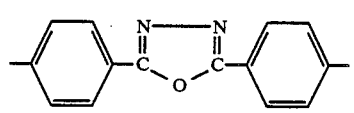

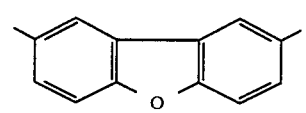

-continued

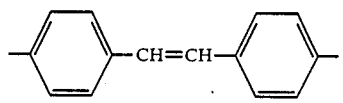

However, isoindolinone colorants are not necessarily limited to these compounds.

Commercially available isoindolinone colorants (trade names) are as follows:

Irgadine Yellow 2GLT, 2GLTE, 2GLTN (produced by Ciba Geigy);
Rionogen Yellow 3GX (produced by Toyo Ink);
Fastgen Super Yellow GR, GRO, GROH (produced by Dainippon Ink);
Rionogen Yellow RX (produced by Toyo Ink);
Risol Fast Yellow 1840 (produced by BASF);
Kayaset Yellow E-2RL, E-3RL176 (produced by Nippon Kayaku);
Chromophthal Orange 2G (produced by Ciba Geigy), and the like.

Anthraquinone colorants refer to derivatives of anthraquinone and similar quinones.

Typical examples of the structures of anthraquinone yellow colorants are shown below:

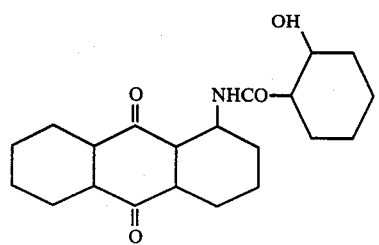

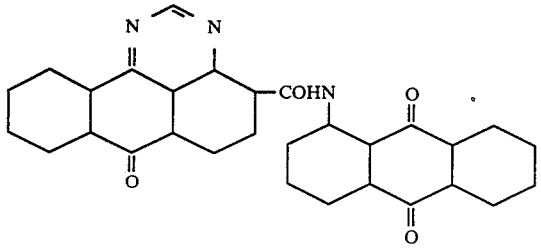

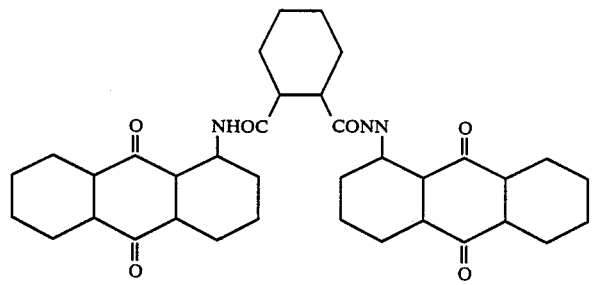

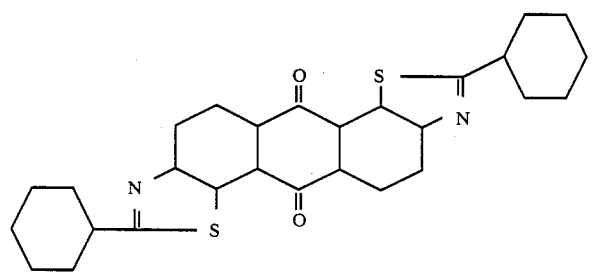

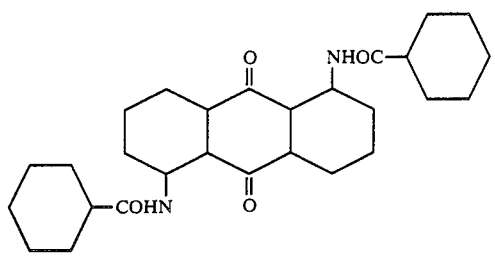
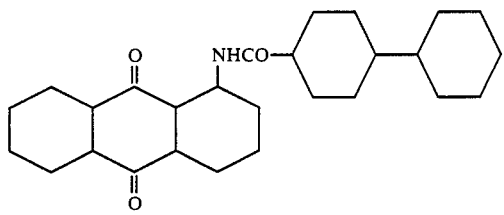
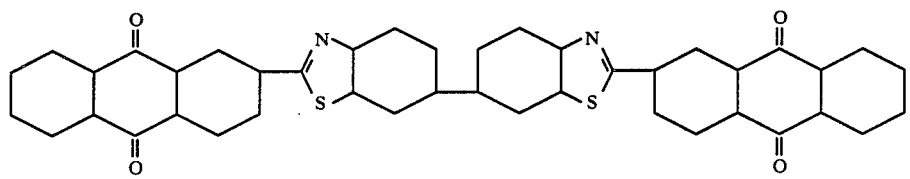
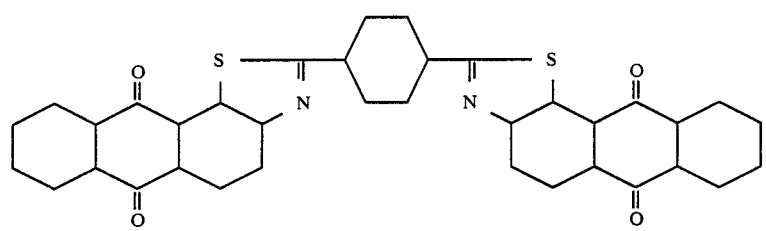
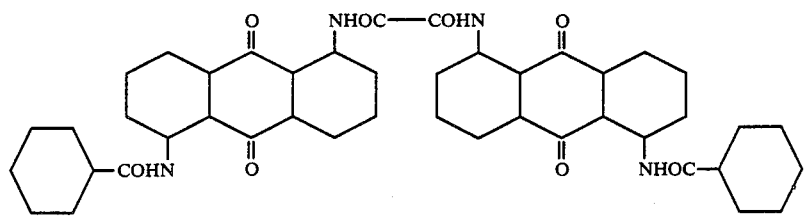
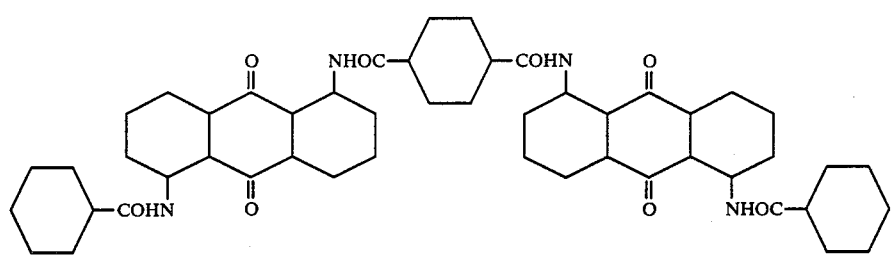
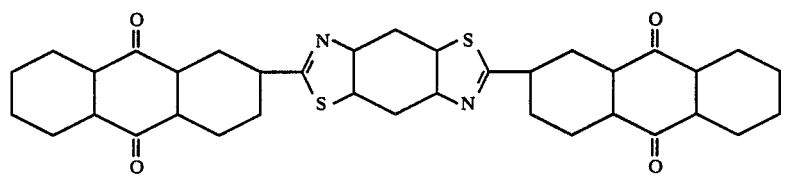
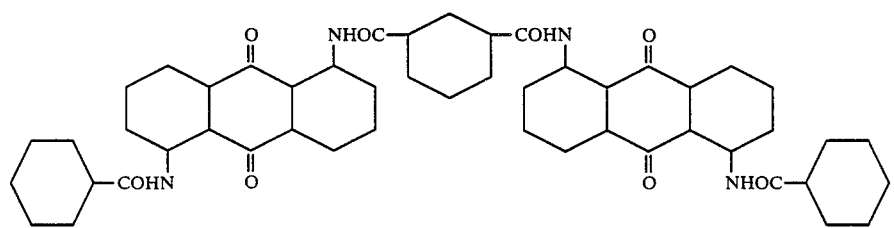

-continued

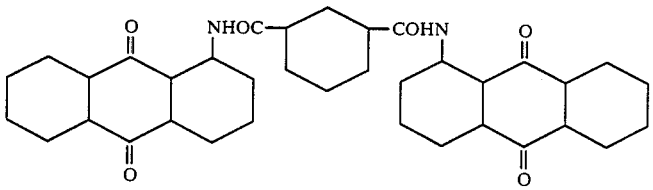

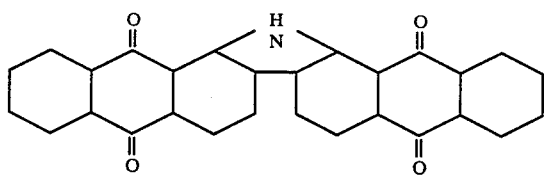

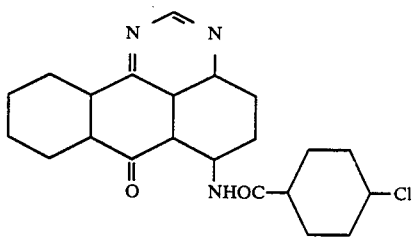

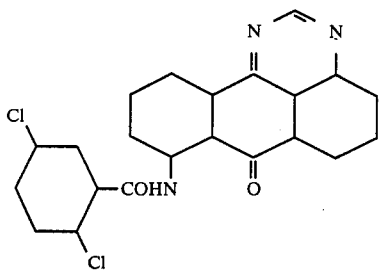

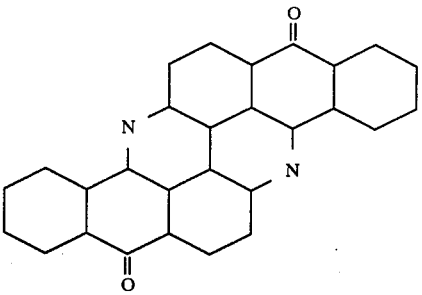

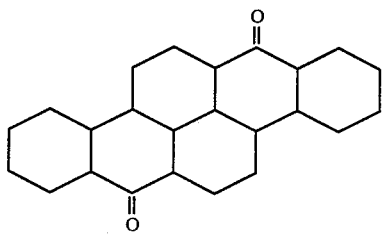

However, anthraquinone colorants are not necessarily limited to these examples.

Commercially available examples of such anthraquinone colorants are shown below in terms of trade names:

Chromophthal Yellow A2R (produced by Ciba Geigy) C.I. No. 70600;
Heriofast Yellow E3R (produced by Bayer);
Pariogen Yellow L1560 (produced by BASF) C.I. No. 68420;
Kayaset Yellow E-R (produced by Nippon Kayaku) C.I. No. 65049;
Chromophthal Yellow AGR (produced by Ciba Geigy);
Biplast Yellow E2G (produced by Bayer);
Nihonthrene Yellow GCN (produced by Sumitomo Kagaku) C.I. No. 67300;
Mikethrene Yellow GK (produced by Mitsui Toatsu) C.I. No. 61725;
Indanthrene Printing Yellow GOK (produced by Hoechst) C.I. No. 59100;
Anthrazol Yellow V (produced by Hoechst) C.I. No. 60531;
Mikethrene Soluble Yellow 12G (produced by Mitsui Toatsu) C.I. No. 60605;
Mikethrene Yellow GF (produced by Mitsui Toatsu) C.I. No. 66510;
Nihonthrene Yellow GCF (produced by Sumitomo Kagaku) C.I. No. 65430;
Indanthrene Yellow 3G (produced by Bayer) C.I. No. 65405;
Nihonthrene Yellow 4GL (produced by Sumitomo Kagaku);
Indanthrene Yellow 5GK (produced by Bayer) C.I. No. 65410;
Balanthrene Yellow PGA (produced by BASF) C.I. No. 68400;
Cibanone Yellow 2G (produced by Ciba Geigy);
Indanthrene Yellow F2GC (produced by Hoechst);
Anthrazol Yellow IGG (produced by Hoechst);
Indanthrene Yellow 5GF (produced by BASF);
Mikethrene Yellow 3GL (produced by Mitsui Toatsu);
Indanthrene Yellow LGF (produced by BASF);
Monolite Yellow FR (produced by ICI);
Kayaset Yellow E-AR (produced by Nippon Kayaku).

As the blue colorants, there may be included phthalocyanine colorants or combinations of phthalocyanine colorants and quinacridone dyes as preferable examples.

Phthalocyanine colorants are as described above, and quinacridone colorants have the basic skelton as shown by the formula (I), including also the derivatives derived therefrom:

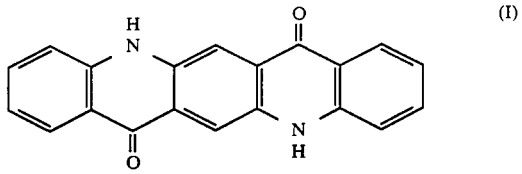

Examples of the derivatives may include the following compounds:

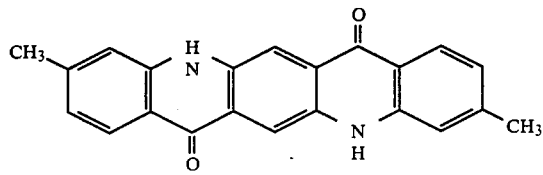

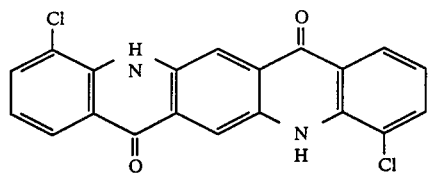

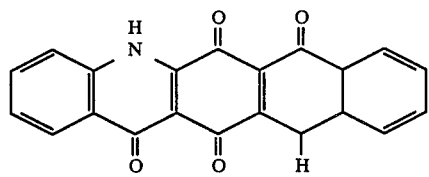

Mixtures of these compounds may also be included. All of them have excellent spectral characteristics of magenta colorants.

Typical examples of the colorants may include:
Rionogen Magenta R (trade name: produced by Toyo Ink);
Fastgen Supermagenta R, RS (trade names: produced by Dainippon Ink);
Sincacia Red BRT, YRT (trade names: produced by Du Pont);
Sincacia Violet BRT (trade name: produced by Du Pont).

As the resist to be used for resist mask, any material which can be dissolved afterwards may be available, irrespectively of whether it may be either negative type or positive type. However, in the case of a negative type, crosslinking will generally proceed by irradiation of radiation, and therefore a solvent having strong dissolving power is required for dissolution. Therefore, it is not preferablem because the colorant layer may be damaged or dissolved.

In this respect, in the case of a positive type resist, particularly after formation of the resist pattern, it can become soluble by irradiation of radiation over the entire surface, whereby a solvent in which the colorant is less soluble as compared with the negative type can preferably be selected for lift-off. The positive type resist is inclusive of a variety of resin components, and various kinds of solvents are used for coating or developing thereof. It is desirable to select a positive type resist for which a solvent having less action on the colorants can be used. The typical example may preferably the positive type resist composed mainly of polymeric units of a fluorine-containing methacrylate represented by the formula shown below. This resist can be well dissolved in not only good solvents having high dissolving ability such as esters, aromatics, halogenated hydrocarbons, etc. as a matter of course, but also in poor solvents with low dissolving ability, and therefore a solvent with little influence on the colorants film can be employed.

Examples of such resists may include FPM210, FBM110 and FBM120 (all are trade names produced by Daikin Kogyo).

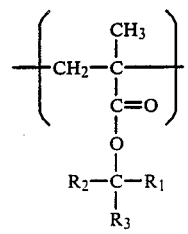

wherein $R_1$ and $R_2$ represent hydrogen or alkyl group, $R_3$ alkyl group in which at least one fluorine is bonded to each carbon atom.

The typical examples may include the following:

| $R_1$ | $R_2$ | $R_3$ |
|---|---|---|
| H | H | $-CF_2-CF_2H$ |
| $CH_3$ | $CH_3$ | |
| H | H | $-CF_2-CFH-CF_3$ |
| H | $CH_3$ | |
| H | $C_2H_5$ | |
| H | $C_3H_7$ | |
| $CH_3$ | $CH_3$ | |
| $CH_3$ | $C_2H_5$ | |
| H | $H_2$ | $-CF_2-CF_2-CF_2CF_2H$ |
| $CH_3$ | $·CH_3$ | |

As other resists, there may be employed conveniently various kinds of commercial products sold under the trade names as set forth below:
AZ series: 111, 110A, 120, 340, 1350B, 1350J, 1370, 1375, 1450, 1450J, 1470, 1475, 2400, 2415, 2430 (all produced by Sipley);
Waycoat HPR-204, 205, 206, 207, 1182, Way coat MPR (all produced by Hunt);
Kodak Micro Positive Resist (produced by Kodak);
Isofine Positive Resist (produced by Microimage Technology);
PC 129, 129SF (produced by Polychrome);
OFPR 77, 78, 800, OEBR 1000, 1010, 1030, ODUR 1000, 1001, 1010, 1013, 1014 (all produced by Tokyo Oka);
EBR 1,9 (produced by Toray);
FMR E100, E101 (produced by Fuji Yakuhin Kogyo);
JSR Positive Photoresist PFR 3003 (produced by Nippon Synthetic Rubber);
Selectilux P (produced by Merck), and the like.

In the contact line sensor for color reading of the present invention, the color filter as described above may preferably be used, but it is also possible to use other colorants. As the method for formation of the color filter, in addition to the method as shown in the above embodiment, a method as disclosed in Japanese Laid-open Patent Application (Kokai) No. 146406/1980 may be exemplified. This method comprises repeating the step of forming a color element for the number of the color elements of the necessary color filter through a transparent intermediate protective film (protective film provided so that the photosensors and the color element already formed may not be etched) according to wet etching in which a film of a color material is formed by vapor deposition, a mask is formed with a resist and thereafter patterning is effected with the use of a solvent capable of dissolving selectively the color material, or dry etching in which incineration of a color material is effected by use of gaseous plasma ions, etc.

The color filter to be employed may also be a stained filter which can be prepared by providing a mordant layer comprising a hydrophilic polymeric material such as gelatin, casein, glue or polyvinyl alcohol and forming a colored layer by staining the mordant layer with a colorant. By use of this stained filter, spectral characteristics required for a filter can be accomodated with relative ease.

Figure 6:
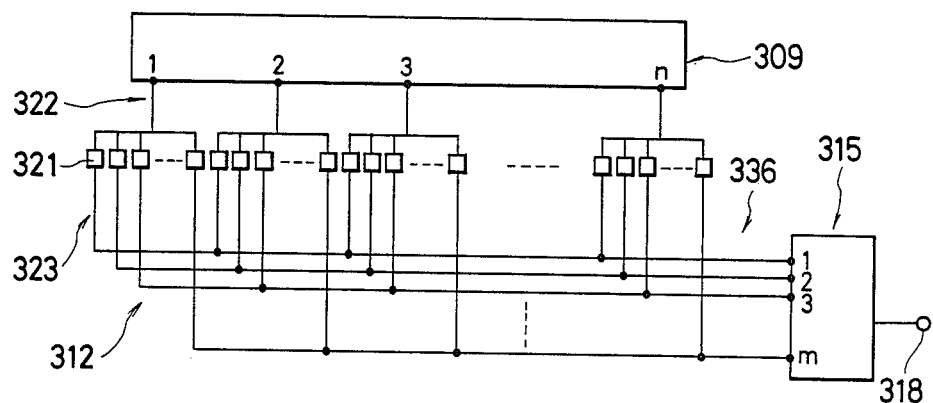
FIG. 6 is a schematic circuit diagram for illustration of the method for driving the line sensor.

FIG. 6 is a schematic circuit diagram for illustration of the method for driving the line sensor for color reading of the above embodiment, and here is shown only the line sensor for red color. As shown in the drawing, 3500 photosensors having a-Si photoconductive layer 321 are blocked for every m photosensors, said blocks existing in number of n (m×n=3500). For each block, the common electrode 322 is connected to the driver IC 309, and voltage is applied on the common electrodes 322 successively in the block order from the left side for a certain period of time. On the other hand, the individual electrodes 323 are connected commonly to those with the same order number from the left side of respective blocks as mentioned above to form a matrix wiring section 312, and its signal take-out electrode 336 is connected to the signal processing IC 315. Thus, by the signal processing IC 315, for the photosensors of m×n, in the order from the left side, the red signal is outputted serially from the video signal output line 318.

Having described above by referring only to the red color line sensor, the same matrix driving can be performed similarly at the same time for the green color line sensor and the blue line sensor, whereby the green signal and blue signal can be outputted serially from the video signal output lines 319 and 320, respectively, for the m×n photosensors successively from the left side.

Figure 7:
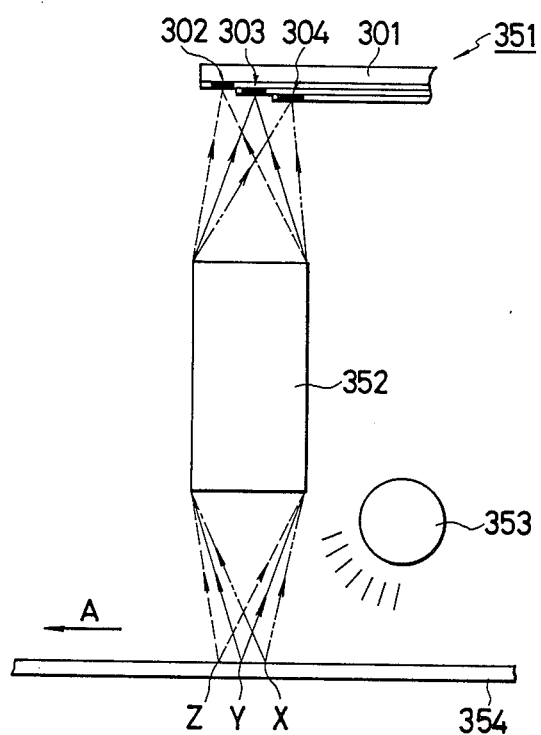
FIG. 7 is a schematic side view for illustration of the color manuscript reading.

FIG. 7 is a schematic side view for illustration of color manuscript reading by use of the line sensor for color reading of this embodiment. In this Figure, 351 is the contact line sensor for color reading as described in the above embodiment. In said line sensor 351, photosensors are arranged one-dimensionally in the direction perpendicular to the paper surface. 352 is a rod lens array, extending in the direction perpendicular to the paper surface similarly as the line sensors 351. 353 is an incandescent light source in shape of a line, also extending in the direction perpendicular to the paper surface similarly as the line sensor 351. 354 is a manuscript to be read, said manuscript 354 being coveyed in the direction of the arrowhead A.

Turning on a certain portion of the manuscript 354, said portion, as the manuscript moves, is first subjected to reading of the blue information by the line sensor 304 for blue color at the position X, then reading of the green color information by the line sensor 303 for green color at the position Y and then reading of the red color information by the line sensor 302 for red color at the position Z. And, said portion is aligned so that reading may be effected with the same order number of the respective photosensors of the line sensor for red color, the line sensor for green color and the line sensor for blue color.

Accordingly, it is possible to constitute the three line sensors such that one of the line sensors for which the reading of the same portion of the manuscript 354 is performed finally (the line sensor 302 for red color in the case of FIG. 7) is used as the reference and other two line sensors (the line sensor 303 for green color and the line sensor 304 for blue color in FIG. 7) are provided externally with line memories corresponding to the preceding lines to be read from the reference line sensor, whereby the three color signals can be outputted finally at the same time for the same line to be read in the manuscript.

FIG. 6 shows the simplest matrix wiring, but this circuit can be modified variously such as a constitution in which TFT (Thin Film Transistor) with a-Si is further added to each individual electrode, a constitution in which a blocking diode is added, a constitution in which a capacitor comprising an amorphous SiNH film, etc. is added for voltage transformation, or a constitution comprising a suitable combination of these.

Figure 1:
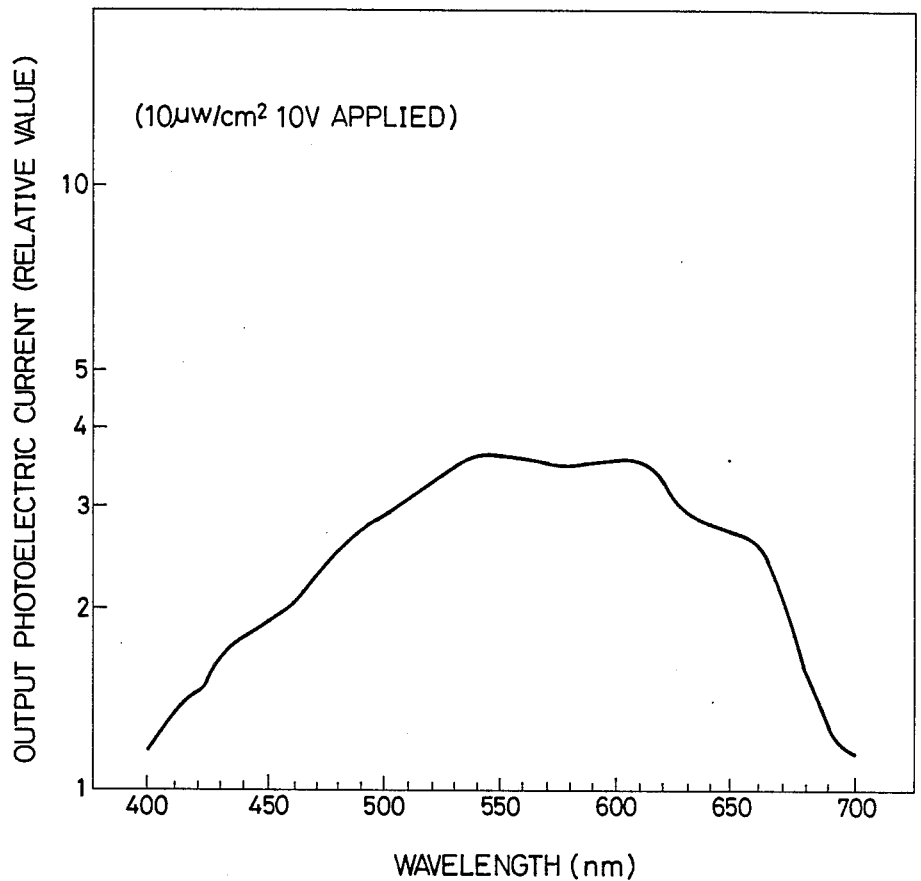
FIG. 1 is a graph showing the spectral sensitivity characteristic of an a-Si photosensor.
Figure 2:
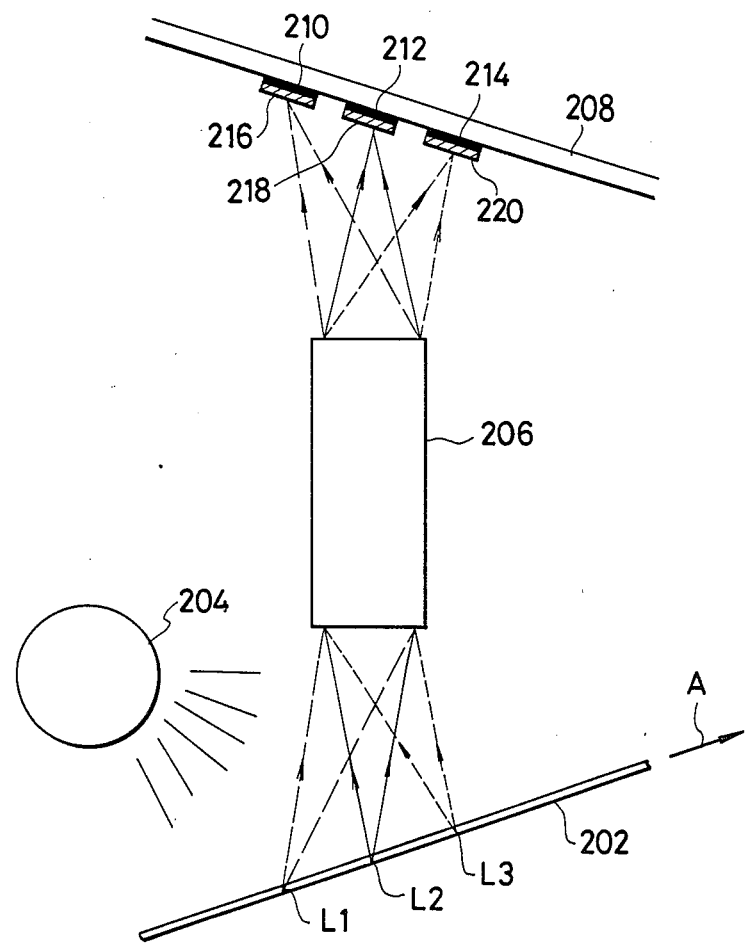
FIG. 2 is a schematic illustration of the constitution of an embodiment of a color image reading devive of the prior art.
Figure 8:
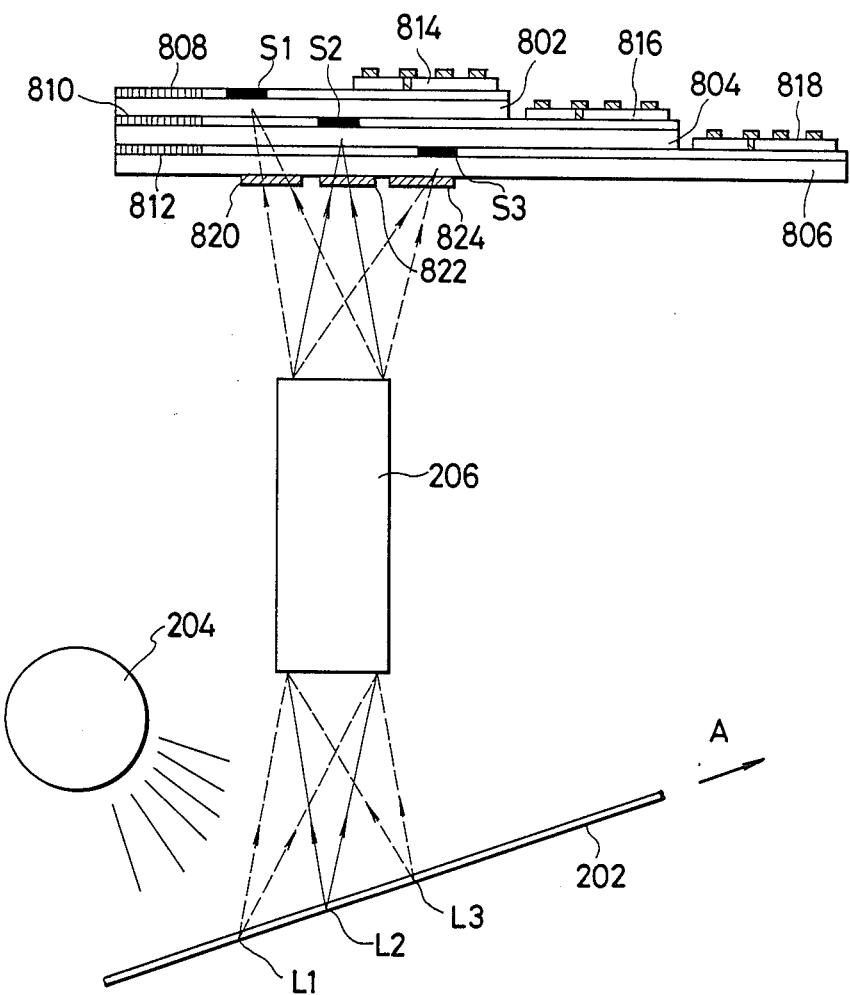
FIG. 8 is a schematic illustration of the construction of a first embodiment of the color image reading device according to the present invention.

FIG. 8 is a schematic illustration showing the construction of a first embodiment of the color image reading device according to the present invention. In this drawing, however, the same constituents as in the prior art device shown in FIG. 2 are affixed with the same numerals for brevity of explanation.

In this figure, photosensor arrays S1, S2 and S3 are formed respectively, on the glass substrates 802, 804 and 806, said glass substrates 802, 804 and 806 being laminated so that the respective sensor arrays may be at desired positions, thus constituting an image sensor.

On the respective glass substrates 802, 804 and 806, the common wirings 808, 810 and 812, and matrix wirings 814, 816 and 818 are formed as mentioned later, respectively, and the photosensor arrays S1–S3 are driven by these wirings. It should be noted that at least the wirings of the electrodes of the photosensor arrays S2, S3 and in the vicinity thereof are formed of a transparent conductor ITO (Indium Tin Oxide) for permitting light to be incident on the photosensor arrays S1 and S2 without trouble.

Also, on the light-receiving side of the glass substrate 806, the red color filter 820, the green color filter 822 and the blue color filter 824 are formed, respectively, and the light transmitted through the red color filter 820 will enter the photosensor array S1, the light transmitted through the green color filter 822 the photosensor array S2, and the light transmitted through the blue filter 824 the photosensor array S3, respectively.

Thus, the photosensor array S1 is arranged at the position where the red color component of the image at the position L1 of the manuscript 202 forms the image by the ommateal optical system 206, similarly the photosensor array S2 at the position where the green component of the image at the position L2 forms the image, and the photosensor array S3 at the position where the blue component of the image at the position L3 forms the image.

Figure 9:
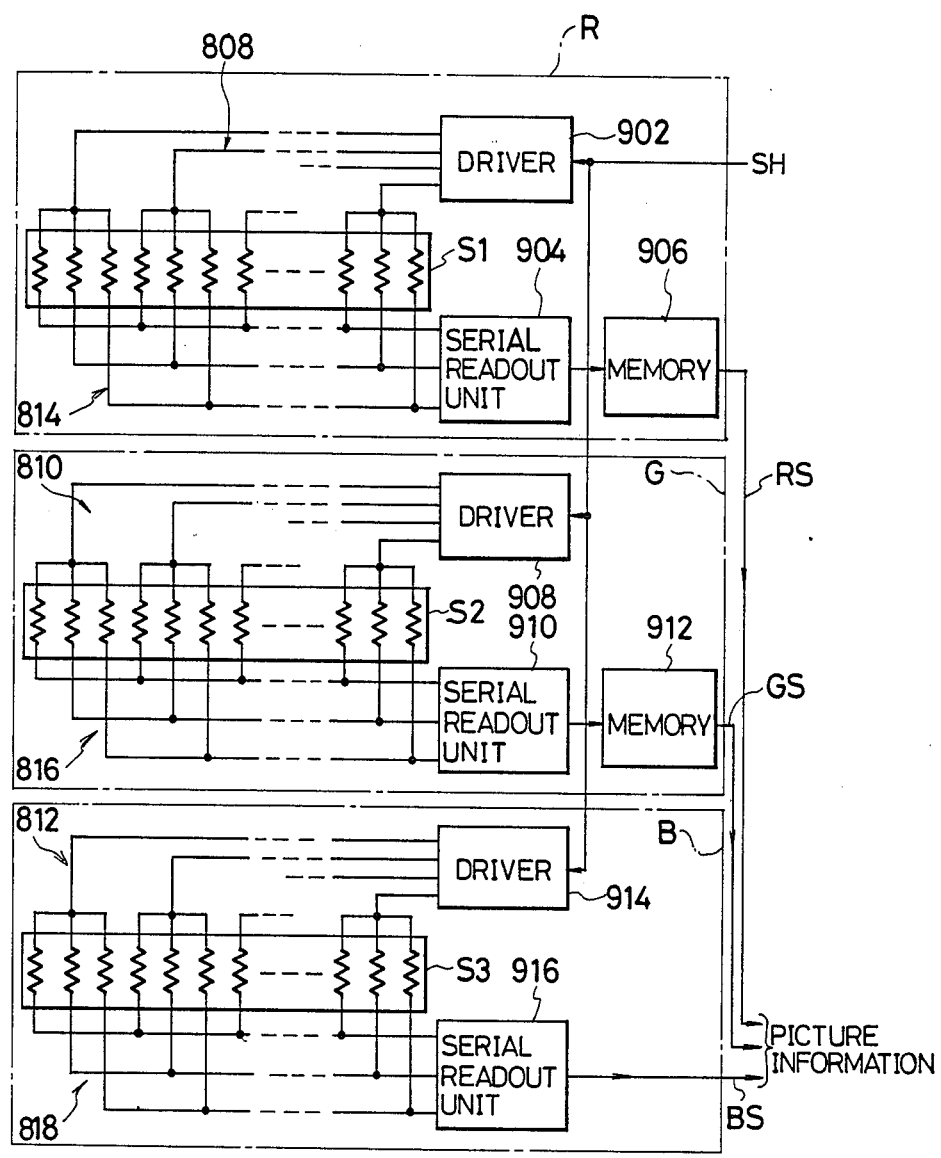
FIG. 9 is a schematic illustration of the matrix circuit for actuating this embodiment.

FIG. 9 is a schematic circuit diagram of the matrix driving circuit for actuating this embodiment. It should be noted that the same numerals are attached to the same portions as in FIG. 8. Also, since the portion R for reading red component, the portion G for reading green component and the portion B for reading blue component are constituted mostly of the same constitution, the portion R is described as representative of these portions.

The respective photosensors of the photosensor array S1 are connected commonly in a certain number (for each block) at one terminal so as to be applied successively with voltage through the common wiring 808 by the driver 902.

The photosensors to which voltage is applied by the driver 902 become activated, whereby the photocurrent corresponding to the light of the red component transmitted through the red color filter 820 will flow. The photocurrent is inputted through the matrix wiring 814 into the series reading portion 904, where it is made serial and housed once into the memory 906. The driver 902 applies current successively on the blocks of the photosensor array S1, following the controlling signals SH from the controlling portion (not shown). By this, the information of the red component of the image I in the manuscript 202 at the position L1 is housed in the memory 906.

The photosensor array S2, the driver 908, the series reading portion 910 and the memory 912 at the portion G have the same constitution and actuation as the portion R. However, in the memory 912, the green component of the image I in the manuscript 202 is housed. That is, the image I in the manuscript 202 of which the red component information is read at the position L1 is read of its green component information by the photosensor array S2 to be housed in the memory 912 when said image is migrated to the position L2.

Similarly, at the portion B, the blue component information BS at the position L3 of the image I in the manuscript 202 is read. At the same time, the red component information RS and the green component information GS housed in the memory 906 and 912 are read to be outputted as the color image information of one line.

By performing the above actuation while moving the manuscript in the direction of the arrowhead A, the color image information of the whole manuscript 202 can be read.

The common wirings 808, 810, 812 and the matrix wiring 814, 816 and 818 will generally occupy large areas, but, in the present embodiment as shown in FIG. 8, the substrates 802, 804 and 806 are independent of each other, and therefore the matrix wirings, etc. can easily be prepared.

Figure 10:
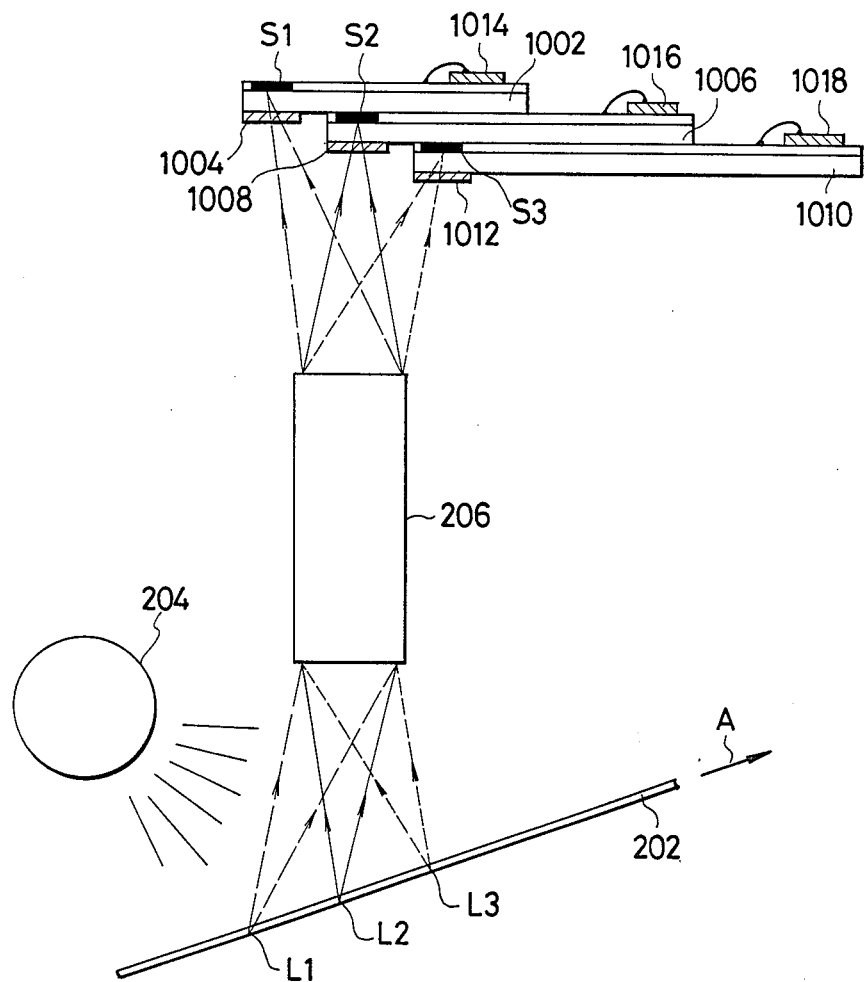
FIG. 10 is a schematic illustration of the construction of a second embodiment of the present invention.

FIG. 10 is a schematic illustration of the construction of a second embodiment of the present invention.

In this figure, on a glass substrate 1002, a photosensor array S1 and a red color filter 1004 on the light-receiving side of the photosensor array S1 are formed. Similarly, on a glass substrate 1006, a photosensor array S2 and a green filter 1008, and on a glass substrate 1010, a photosensor array S3 and a blue filter 1012 are formed. Also, the circuit chips 1014, 1016 and 1018 for driving the respective photosensor arrays S1–S3 are formed on the glass substrates 1002, 1006 and 1010, respectively.

These glass substrates 1002, 1006 and 1010 are laminated and secured such that the photosensor arrays S1–S3 may be arranged at respective predetermined positions. That is, the photosensor array S1 is fixed at the position where the red component of the image at the position L1 in the manuscript 202 forms image by the ommateal optical system 206, similarly the photosensor S2 at the position where the green component of the image at the position L2 forms image, and the photosensor S3 at the position where the blue component of the image at the position L3 forms image, respectively.

The respective outputs of the photosensor arrays S1–S3 corresponding to the respective colors will be scanned by the respective circuit chips 1014, 1016 and 1018 to be read. Accordingly, by moving the manuscript 202 in the direction of the arrowhead A at a predetermined speed, the color image of the manuscript 202 as a whole can be read.

Thus, even in the case of employing no matrix circuit, since the substrates 1002, 1006 and 1010 are independent of each other, there is no specific restriction with respect to taking out from the wirings of the photosensor arrays S1–S3, whereby the structure can be simplified.

Figure 11:
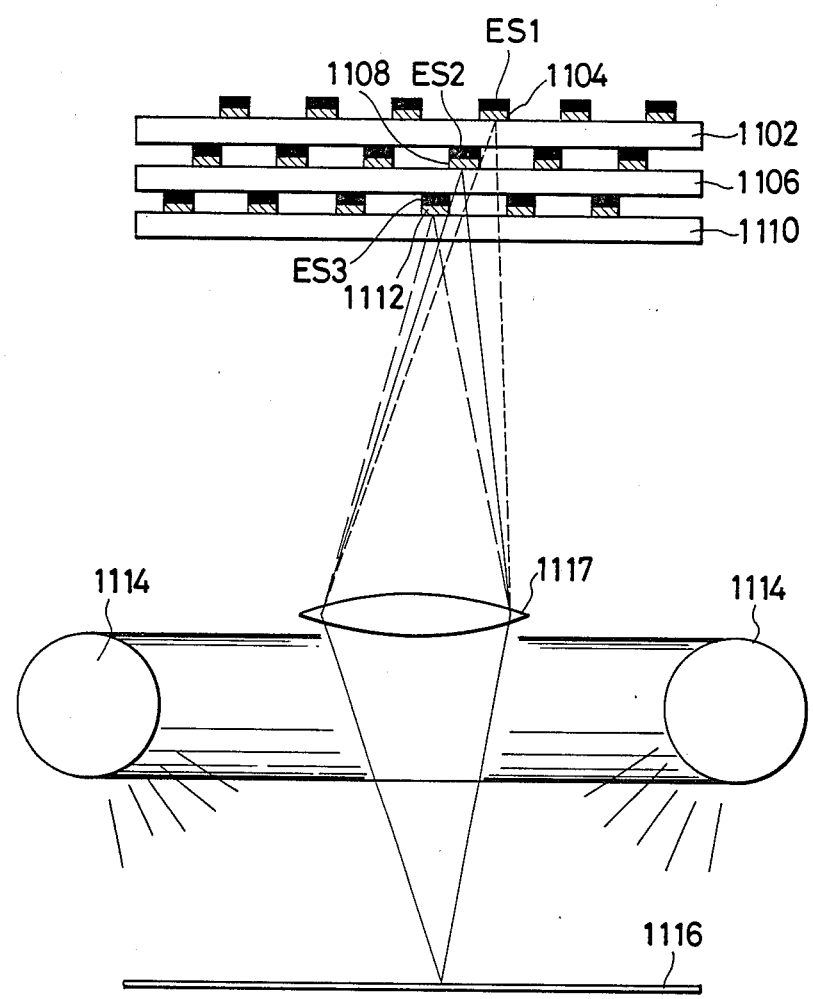
FIG. 11 is a schematic illustration of the construction of a third embodiment of the present invention.

FIG. 11 is a schematic illustration of the construction of a third embodiment of the present invention. The present invention is also applicable for such a two-dimensional image sensor.

In this figure, on a glass filter 1102, photosensor arrays ES1 are formed at predetermined intervals through red color filters 1104, similarly the photosensor arrays ES2 through green filters 1108 on a glass substrate 1106, and photosensor arrays ES3 through blue filters 1112 on a glass substrate 1110, respectively, at predetermined intervals. Thus, the photosensors detecting respective colors are arranged in a matrix to constitute a two-dimensional image sensor.

The image on a manuscript 1116 illuminated by a ring-shaped light source 1114 forms an image on the two-dimensional sensor by an optical system 1117. In this case, the information corresponding to one image element of the image in the manuscript 1116 can be read by the three photosensors corresponding to the respective colors, and the respective photosensors are arranged at the positions where the light of the respective colors form images, respectively.

In the case of a two-dimensional image sensor, in addition to the requirement of forming the photosensors for constituting the respective image elements adjacent to each other, precision is also demanded. However, according to this embodiment, photosensors are formed and laminated on the three glass substrates 1102, 1106 and 1110 corresponding to the respective colors to form a two-dimensional image sensor, and therefore a high precision two-dimensional image sensor can be prepared. Further, it is not necessary to correct completely the color aberration and therefore miniaturization and lowering in cost can be achieved.

The color filters of respective colors to be provided in the sensors in the respective embodiments described in FIGS. 8 through 11 may be the same as those described in FIG. 3 and FIG. 4.

According to the line sensor for color reading of the present invention as described above, the color signals corresponding accurately to the reading image elements in color reading can be obtained, whereby it is rendered possible to reproduce images faithful to the manuscript and reproduce clearly the solid letters and fine lines without error signals of fringe. Also, high speed reading is possible, because reading of plural colors can be done at the same time.

In the line sensor for color reading of the present invention, when the photoconductive element of the photosensors is a-Si, the colorant layers comprising the pigment as shown specifically in the specification as the main component can be used as the color filter to give particularly good results.

Also, the color image reading device according to the present invention forms photosensors on a plurality of independent substrates for respective colors to constitute an image sensor by lamination of these substrates, the photosensors on the respective substrates being arranged at the optimum image forming positions for the light within the wavelength range corresponding to the respective colors. Therefore, the photosensors for respective colors can be prepared independently and the production yield can be improved to a great extent.

Also, since the photosensors for respective colors are formed on independent substrates, the wiring space can be sufficiently ensured and preparation of wiring can be very easy.

Further, because the photosensors for respective colors are arranged at optimum image forming positions, color image information of high resolution can be obtained. In addition, a light optical system can be used to improve the reading speed.

Also, even by use of an optical system with large color aberration, a high resolution can be obtained and therefore the device can be made compact at low cost.

We claim:

1. A line sensor for color reading which comprises:
   a substrate;
   a first line sensor and a first electrode-wiring portion electrically connected to said first line sensor provided on said substrate;
   a first electrically-insulating layer provided at least on said first electrode-wiring portion;
   a second line sensor and a second electrode-wiring portion electrically connected to said second line sensor provided on said first electrically-insulating layer;
   a second electrically-insulating layer provided at least on said second electrode-wiring portion;
   a third line sensor and a third electrode-wiring portion electrically connected to said third line sensor provided on said second electrically-insulating layer; and
   color filters having different color separation characteristics from each other, provided so as to correspond to said first, second and third line sensors.

2. A line sensor for color reading according to claim 1, wherein each said sensor comprises an amorphous silicon photoconductive layer.

3. A line sensor for color reading according to claim 1, wherein:
   said line sensors are substantially parallel with each other;
   adjacent ones of said line sensors are spaced apart from each other by a predetemrined distance;
   each of said line sensors has a photosensor portion which comprises a plurality of photosensing elements each being for reading a corresponding image elements of a predetermined length; and
   the deviation of each line sensor from exact parallelism with the others of said line sensors and the deviations in the distances between the photosensor portions of adjacent ones of said line sensors are not more than half of said predetermined length.

4. A line sensor for color reading according to claim 1, wherein each of the color filters comprises a colorant layer containing a pigment as the main component.

5. A line sensor according to claim 1, wherein said substrate and said first and second electrically-insulating layers are transmissive to incident light.

6. A line sensor according to claim 1, wherein at least said first and second electrically-insulating layers are transmissive to incident light.

7. A color image reading device comprising:
   (1) a line sensor for color reading which comprises:
      a substrate;
      a first line sensor and a first electrode-wiring portion electrically connected to said first line sensor provided on said substrate;
      a first electrically-insulating layer provided at least on said first electrode-wiring portion;
      a second line sensor and a second electrode-wiring portion electrically connected to said second line sensor provided on said first electrically-insulating layer;
      a second electrically-insulating layer provided at least on said second electrode-wiring portion;
      a third line sensor and a third electrode-wiring portion electrically connected to said third line sensor provided on said second electrically-insulating layer; and
      color filters having different color separation characteristics from each other provided so as to correspond to said first, second and third line sensors;
   (2) an illuminating means for irradiating a manuscript surface with light; and
   (3) an optical image forming means for forming respective images on light-receiving surfaces of said line sensors from an image on the manuscript surface.

8. A color image reading device according to claim 7, wherein each of the color filters comprises a colorant layer containing a pigment as the main component.

* * * * *

UNITED STATES PATENT AND TRADEMARK OFFICE
CERTIFICATE OF CORRECTION

PATENT NO. : 4,763,189
DATED : August 9, 1988
INVENTOR(S) : TOSHIYUKI KOMATSU, ET AL.

It is certified that error appears in the above-identified patent and that said Letters Patent is hereby corrected as shown below:

COLUMN 1

Line 47, "Another" should read --As another--.

COLUMN 2

Line 14, "red" should read --read--.
Line 19, "miniturization" should read --miniaturization--.
Line 66, "some the" should read --some of the--.

COLUMN 3

Line 2, "4,558,357," should read --4,558,357).--.
Line 3, "referred" should read --referred to--.
Line 15, "will" should be deleted.
Line 16, "202 form" should read --202 will form--.
Line 47, "parallel each" should read --parallel with each--

COLUMN 7

Line 62, "perpylenetetracarboxylic" should read --perylenetetracarboxylic--.
Line 67, "71130" should read --71130;--.
Line 68, "No. 71137" should read --No. 71137;--.

UNITED STATES PATENT AND TRADEMARK OFFICE
CERTIFICATE OF CORRECTION

PATENT NO. : 4,763,189
DATED : August 9, 1988
INVENTOR(S) : TOSHIYUKI KOMATSU, ET AL.

It is certified that error appears in the above-identified patent and that said Letters Patent is hereby corrected as shown below:

COLUMN 8

Line 1, "CI No. 71145" should read --CI No. 71145;--.
    Line 2, "CI No. 71127" should read --CI No. 71127.--.

COLUMN 10

Line 49, "CONN" should read --COHN--.

COLUMN 15

Line 2, "skelton" should read --skeleton--.
    Line 36, "H" should read --$H^N$--.
    Line 57, "preferablem" should read --preferable--.

COLUMN 16

Line 2, "ably the" should read --ably be the--.
    Line 47, "110A," should read --119A,--.

COLUMN 17

Line 23, "accomodated" should read --accommodated--.
    Line 45, "oolor" should read --color--.
    Line 65, "Turning on" should read --In reading--.

COLUMN 18

Line 52, "respectively-" should read --respectively,--.
    Line 53, ", and" should read --and--.

UNITED STATES PATENT AND TRADEMARK OFFICE
CERTIFICATE OF CORRECTION

PATENT NO. : 4,763,189
DATED : August 9, 1988
INVENTOR(S) : TOSHIYUKI KOMATSU, ET AL.

It is certified that error appears in the above-identified patent and that said Letters Patent is hereby corrected as shown below:

COLUMN 22

Line 6, "elements" should read --element--.

Signed and Sealed this

Fourth Day of April, 1989

Attest:

DONALD J. QUIGG

*Attesting Officer*    *Commissioner of Patents and Trademarks*